(12) United States Patent
Kim

(10) Patent No.: US 8,624,283 B2
(45) Date of Patent: Jan. 7, 2014

(54) LIGHT EMITTING DEVICE, MANUFACTURING METHOD THEREOF, LIGHT EMITTING DEVICE PACKAGE, AND LIGHTING SYSTEM

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 433 days.

(21) Appl. No.: 13/092,287

(22) Filed: Apr. 22, 2011

(65) Prior Publication Data

US 2011/0260189 A1    Oct. 27, 2011

(30) Foreign Application Priority Data

Apr. 23, 2010   (KR) .................. 10-2010-0037944

(51) Int. Cl.
*H01L 33/00* (2010.01)
(52) U.S. Cl.
USPC .. 257/98; 257/99; 257/E33.069; 257/E33.074
(58) Field of Classification Search
USPC ................. 257/98, 99, E33.069, E33.074
See application file for complete search history.

(56) References Cited

U.S. PATENT DOCUMENTS

| 7,541,206 B2 | 6/2009 | Yoon et al. ............ 438/29 |
| 8,143,639 B2 * | 3/2012 | Jeong et al. ............ 257/98 |
| 8,334,153 B2 * | 12/2012 | Gotoda et al. ............ 438/29 |
| 2006/0273335 A1 * | 12/2006 | Asahara et al. ............ 257/98 |
| 2010/0264440 A1 | 10/2010 | Park ............ 257/98 |

FOREIGN PATENT DOCUMENTS

| CN | 101026212 A | 8/2007 |
| CN | 101593805 A | 12/2009 |
| JP | 2008-103626 A | 5/2008 |
| JP | 2008-159664 A | 7/2008 |
| JP | 2010-080741 A | 4/2010 |
| KR | 10-2007-0088176 A | 8/2007 |
| KR | 10-2008-0014253 A | 2/2008 |
| KR | 10-2009-0054008 A | 5/2009 |
| TW | 200701526 A | 1/2007 |
| WO | WO 2009/028861 A2 | 3/2009 |
| WO | WO 2009/069929 A2 | 6/2009 |

OTHER PUBLICATIONS

Chinese Office Action dated Apr. 1, 2013 issued in Application No. 201110108231.2.

* cited by examiner

*Primary Examiner* — Minh-Loan T Tran
(74) *Attorney, Agent, or Firm* — Ked & Associates LLP

(57) ABSTRACT

A light emitting device is provided. The light emitting device includes a first electrode layer, a light emitting structure, and a second electrode layer. The light emitting structure is formed on the first electrode layer to emit blue series light having a main peak wavelength region of about 430 nm to about 470 nm, and includes a light extraction structure. The second electrode layer includes a first layer, which is formed of a metal material different from a wavelength of the blue series light in Plasmon frequencies, on the light extraction structure.

20 Claims, 9 Drawing Sheets

US 8,624,283 B2

LIGHT EMITTING DEVICE, MANUFACTURING METHOD THEREOF, LIGHT EMITTING DEVICE PACKAGE, AND LIGHTING SYSTEM

CROSS-REFERENCE TO RELATED APPLICATIONS

The present application claims priority under 35 U.S.C. 119 and 35 U.S.C. 365 to Korean Patent Application No. 10-2010-0037944 Apr. 23, 2010, which is hereby incorporated by reference in its entirety.

BACKGROUND

The present disclosure relates to a light emitting device, a manufacturing method thereof, a light emitting device package, and a lighting system.

Light Emitting Diodes (LEDs) are a type of semiconductor device that converts electric energy into light. LEDs have better features such as low consumption power, semipermanent service life, fast response time, stability, and affinity with environment than the existing light sources such as fluorescent lamps and incandescent lamps. Therefore, much research is being conducted for replacing the existing light source with LEDs. LEDs are increasingly used as the light sources of lighting apparatuses such as Liquid Crystal Displays (LCDs), electric display boards, streetlamps, and all sorts of lamps that are used indoors and outdoors.

SUMMARY

Embodiments provide a light emitting device, a manufacturing method thereof, a light emitting device package, and a lighting system.

Embodiments also provide a light emitting device with enhanced emission efficiency, a manufacturing method thereof, a light emitting device package, and a lighting system.

In one embodiment, a light emitting device includes: a first electrode layer; a light emitting structure formed on the first electrode layer to emit blue series light having a main peak wavelength region of about 430 nm to about 470 nm, and including a light extraction structure; and a second electrode layer including a first layer, which is formed of a metal material different from a wavelength of the blue series light in Plasmon frequencies, on the light extraction structure.

In another embodiment, a light emitting device includes: a first electrode layer; a light emitting structure formed on the first electrode layer to emit blue series light having a main peak wavelength region of about 430 nm to about 470 nm, and including a light extraction structure; a second electrode layer including a first layer, which is formed of a metal material different from a wavelength of the blue series light in Plasmon frequencies, at a certain region of the light emitting structure; and a low refractive layer between the light emitting structure and the second electrode layer, and having a refractive index lower than a refractive index of the light emitting structure.

In further another embodiment, a light emitting device package includes: a body; first and second conductive layers disposed at the body; a light emitting device disposed at the body, and electrically connected to the first and second conductive layers; and a molding member surrounding the light emitting device, wherein the light emitting device includes: a first electrode layer; a light emitting structure formed on the first electrode layer to emit blue series light having a main peak wavelength region of about 430 nm to about 470 nm, and including a light extraction structure; and a second electrode layer including a first layer, which is formed of a metal material different from a wavelength of the blue series light in Plasmon frequencies, on the light extraction structure.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

In description of embodiments, it will be understood that in a case where a layer (or film), a region, a pattern, or components is referred to as being 'on' or 'under' another substrate, layer (or film), region or patterns, the 'on' and 'under' include all the meanings of 'directly' and 'indirectly'. When an element is referred to as being 'on' or 'under', 'under the element' as well as 'on the element' can be included based on the element. Moreover, any reference of the 'on' or 'under' of each layer will be described with reference to the accompanying drawings.

In the accompanying drawings, the thickness or size of each layer (or film), region, pattern or structure may be exaggerated, omitted or schematically illustrated for clarity and convenience and thus does not entirely reflect an actual size thereof.

Hereinafter, a light emitting device, a manufacturing method thereof, a light emitting device package, and a lighting system according to embodiments will be described with reference to the accompanying drawings.

Figure 1:
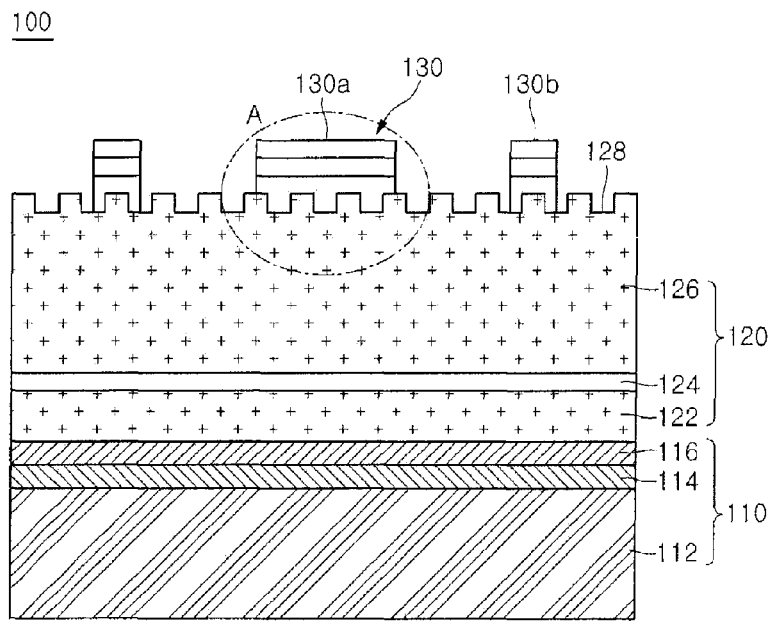
FIG. 1 is a side-sectional view of a light emitting device according to a first embodiment.
Figure 2:
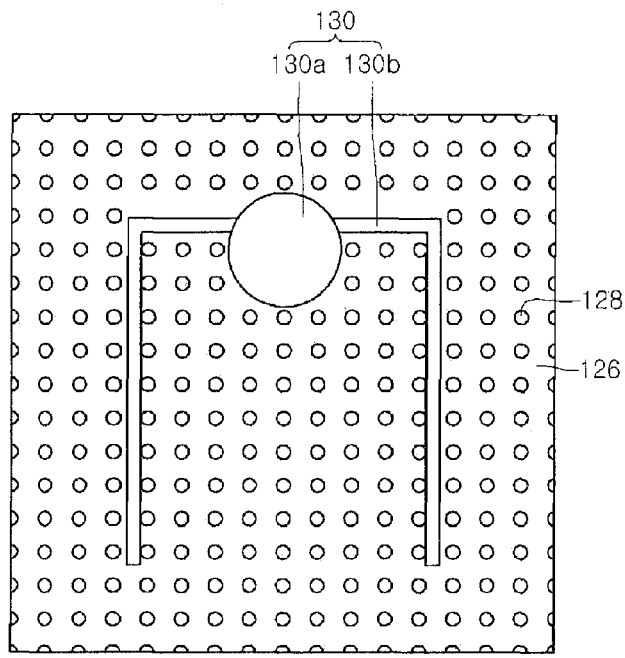
FIG. 2 is a top view of the light emitting device of FIG. 1.
Figure 3:
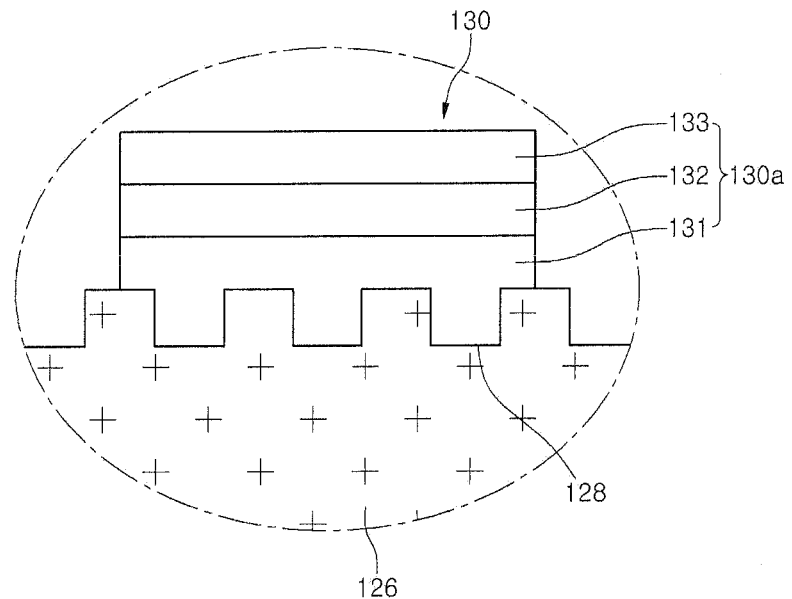
FIG. 3 is an enlarged view of a region A of FIG. 1.

FIG. 1 is a side-sectional view of a light emitting device 100 according to a first embodiment. FIG. 2 is a top view of the light emitting device 100 of FIG. 1. FIG. 3 is an enlarged view of a region A of FIG. 1.

Referring to FIGS. 1 to 3, the light emitting device 100 according to the first embodiment may include a first electrode layer 110, a light emitting structure 120 formed on the first electrode layer 110, and a second electrode layer 130 formed at a partial region of a top of the light emitting structure 120.

The first electrode layer 110 may include a conductive support member 112, a reflection layer 114 on the conductive support member 112, and an ohmic layer 116 on the reflection layer 114. Only one of the reflection layer 114 and the ohmic layer 116 may be formed, in which case the ohmic layer 116 having excellent reflection characteristic may be formed.

The light emitting structure 120 may be formed of a group III-V compound semiconductor and produce light through an electron-hole recombination operation. For example, the light emitting structure 120 may include a second conductive semiconductor layer 122, an active layer 124 on the second conductive semiconductor layer 122, and a first conductive semiconductor layer 126 on the active layer 124.

A light extraction structure 128 may be formed at the top of the light emitting structure 120. The light extraction structure 128 extracts light, which is bound by total reflection internal to the light emitting structure 120, to the outside and thus enhances light extraction efficiency.

The second electrode layer 130 may be formed as a single metal layer or a multi metal layer, and supply a power to the light emitting structure 120 together with the first electrode layer 110. The second electrode layer 130 may include an electrode pad 130a for wire bonding, and a branch 130b for current spreading. The branch 130b may branch from the electrode pad 130a.

Referring to FIG. 3, for example, a first layer 131 that is the lowermost layer of the second electrode layer 130 is formed of a metal having a high reflectivity, and a third layer 133 that is the uppermost layer of the second electrode layer 130 is formed of a metal that has high adhesive strength and thus may easily be wire-bonded. A second layer 132 between the first and third layers 131 and 133 may be formed of a metal for preventing interlayer diffusion between the first and third layers 131 and 133.

The first layer 131 reflect light inputted from the light emitting structure 120, and thus can prevent light incident on the second electrode 130 from being damaged due to light absorption.

The first layer 131 may be formed to include silver (Ag) having a high reflectivity. However, when a concave portion and a convex portion corresponding to a convex portion and concave portion of the light extraction structure 128 are formed at an interface between the first layer 131 and the first conductive semiconductor layer 126, the reflectivity of Ag may be considerably reduced.

Figure 4:
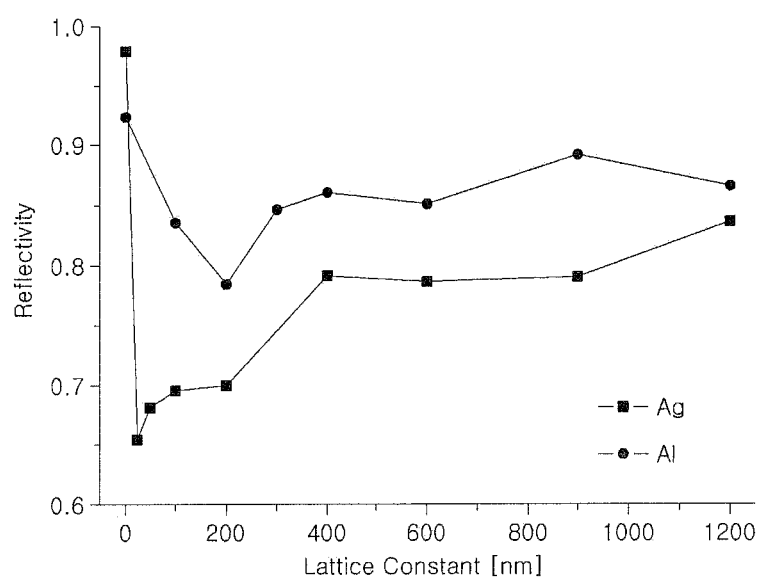
FIG. 4 is a graph showing a simulation result which is obtained by comparing a reflectivity of a case where a first layer, which is the lowermost layer of a second electrode layer of the light emitting device in FIG. 1, is formed of silver (Ag) and a reflectivity of a case where the first layer is formed of aluminum (Al), when a light extraction structure having a periodic pattern is formed at an interface between the first layer and a light emitting structure.

FIG. 4 is a graph showing a simulation result which is obtained by comparing a reflectivity of a case where the first layer 131 is formed of Ag and a reflectivity of a case where the first layer 131 is formed of aluminum (Al), when the light extraction structure 128 having a periodic pattern is formed on the first conductive semiconductor layer 126 of the interface between the first layer 131 and the first conductive semiconductor layer 126. In FIG. 4, the X axis indicates a lattice constant (or period) of the light extraction structure 128, and the Y axis indicates a reflectivity. Light used in an experiment is blue series light having a main peak wavelength region of about 430 nm to about 470 nm.

Referring to FIG. 4, in a case where the first layer 131 is formed of Ag, the first layer 131 has a high reflectivity when the first layer 131 is a smooth surface where the lattice constant of the light extraction structure 128 is close to 0. However, as the lattice constant of the light extraction structure 128 increases, the reflectivity of the first layer 131 decreases rapidly.

On the other hand, in a case where the first layer 131 is formed of Al, a reflectivity of the first layer 131 that is formed of aluminum (Al) is lower than a reflectivity of the first layer 131 that is formed of Ag when the lattice constant of the light extraction structure 128 is 0. However, when the lattice constant of the light extraction structure 128 increases, it can be seen that a reflectivity of the first layer 131 that is formed of aluminum (Al) is higher than a reflectivity of the first layer 131 that is formed of Ag.

This result is shown because the Plasmon frequency of Ag is near to a blue series wavelength. In other words, a portion of blue series light incident on a surface of Ag is changed to a surface Plasmon state and vanished as heat energy, and a reflectivity is reduced by the degree where light is changed to heat energy.

In the first embodiment, therefore, the first layer 131 may be formed to include a metal material having the Plasmon frequencies different from a blue series wavelength, for example, Al instead of Ag.

As seen through the simulation result, when the first layer 131 is formed of a metal material including Al, a reflectivity of the interface between the first layer 131 and the first conductive semiconductor layer 126 is enhanced, thus enhancing the emission efficiency of the light emitting device 100 according to the first embodiment.

Hereinafter, elements of the light emitting device 100 according to the first embodiment will be described in detail.

The first electrode layer 110 may include a conductive support member 112, a reflection layer 114 on the conductive support member 112, and an ohmic layer 116 on the reflection layer 114.

The conductive support member 112 supports the light emitting structure 120, for example, may be formed of at least one of titanium (Ti), chromium (Cr), nickel (Ni), aluminum (Al), platinum (Pt), gold (Au), tungsten (W), copper (Cu), molybdenum (Mo), Cu—W, carrier wafer (for example, silicon (Si), germanium (Ge), gallium arsenide (GaAs), zinc oxygen (ZnO), silicon carbon (SiC), gallium nitrogen (GaN), and $Ga_2O_3$), and a semiconductor substrate with injected impurities.

The reflection layer 114 upward reflects light inputted from the light emitting structure 120, thereby enhancing light extraction efficiency. The reflection layer 114, for example, may be formed to include any one of Ag, Al, Pt, palladium (Pd), and Cu having a high reflectivity. Also, the reflection layer 114 may be formed as a multi-layer with the metal or an alloy and transmission conductive materials such as, indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), and antimony tin oxide (ATO). For example, the reflection layer 114 may be stacked with IZO/Ni, AZO/Ag, IZO/Ag/Ni, and AZO/Ag/Ni.

The ohmic layer 116 forms ohmic contact with the second conductive semiconductor layer 122 of the light emitting structure 120 to smoothly supply a power to the light emitting structure 120. The ohmic layer 116, for example, may be formed to include at least one selected from the group consisting of ITO, IZO(In—ZnO), GZO(Ga—ZnO), AZO(Al—ZnO), AGZO(Al—Ga ZnO), IGZO(In—Ga ZnO), $IrO_x$, $RuO_x$, $RuO_x$/ITO, Ni/$IrO_x$/Au, and Ni/$IrO_x$/Au/ITO, but it is not limited thereto.

The light emitting structure 120 may be formed of a group III-V compound semiconductor. For example, the light emitting structure 120 may include a second conductive semiconductor 122, an active layer 124 on the second conductive semiconductor layer 122, and a first conductive semiconductor layer 126 on the active layer 124.

The second conductive semiconductor layer 122, for example, may be formed as a p-type semiconductor layer, which may be selected from semiconductor materials (for example, InAlGaN, GaN, AlGaN, AlGaN, AlInN, InGaN, AlN, and InN) having a composition equation of $In_xAl_yGa_{1-x-y}N$ (where $0 \leq x \leq 1$, $0 \leq y \leq 1$, and $0 \leq x+y \leq 1$). A p-type dopant such as magnesium (Mg), zinc (Zn), calcium (Ca), strontium (Sr), or barium (Ba) may be doped on the second conductive semiconductor layer 122.

The second conductive semiconductor layer 122 may be formed by injecting TMGa gas, $NH_3$ gas, and ($EtCp_2Mg$) {$Mg(C_2H_5C_5H_4)_2$} gas into a chamber together with hydrogen gas.

The active layer 124 may be formed on the second conductive semiconductor layer 122. The active layer 124 may produce light due to an energy gap difference that occurs in an operation of recombining electrons and holes that are provided from the first and second conductive semiconductor layers 126 and 122.

The active layer 124 may be formed to include a semiconductor material having a composition equation of $In_xAl_yGa_{1-x-y}N$ (where $0 \leq x \leq 1$, $0 \leq y \leq 1$, and $0 \leq x+y \leq 1$). The active layer 124 may be formed in at least one of a single well structure, a Multi Quantum Well (MQW) structure, a quantum dot structure, and a quantum wire structure. When the active layer 124 is formed in the MQW structure, the active layer 124 may be formed by stacking a plurality of well layers and a plurality of barrier layers. For example, the active layer 124 may be formed at a period of InGaN well layer/GaN barrier layer.

The active layer 124 may be formed by injecting TMGa gas, TMIn gas, and $NH_3$ gas into a chamber together with hydrogen gas.

A conductive clad layer may be formed on/under the active layer 140, and the conductive clad layer may be formed of an AlGaN-based semiconductor.

The first conductive semiconductor layer 126, for example, may be formed as an n-type semiconductor layer, which may be selected from semiconductor materials (for example, InAlGaN, GaN, AlGaN, AlGaN, AlInN, InGaN, AlN, and InN) having a composition equation of $In_xAl_yGa_{1-x-y}N$ (where $0 \leq x \leq 1$, $0 \leq y \leq 1$, and $0 \leq x+y \leq 1$). A p-type dopant such as Gi, Ge, or Sn may be doped on the first conductive semiconductor layer 126.

The first conductive semiconductor layer 126 may be formed by injecting TMGa gas, $NH_3$ gas, and $SiH_4$ into a chamber together with hydrogen gas. Also, the first conductive semiconductor layer 126 may be formed as a single layer or a multi layer.

To the contrary, the first conductive semiconductor layer 126 may include a p-type semiconductor layer, and the second conductive semiconductor layer 122 may include an n-type semiconductor layer. Also, a third conductive semiconductor layer (not shown) including an n-type or p-type semiconductor layer may be formed on the second conductive semiconductor layer 122. Therefore, the light emitting structure 120 may include at least one of an np junction structure, a pn junction structure, an npn junction structure, and a pnp junction structure. Also, impurity-doping concentrations of the first and second conductive semiconductor layers 126 and 122 may be conformal or non-conformal. That is, the light emitting structure 120 may be variously formed, but it is not limited thereto.

The light extraction structure 128 may be formed at the top of the light emitting structure 120. The light extraction structure 128 extracts light, which is bound by total reflection internal to the light emitting structure 120, to the outside and thus enhances light extraction efficiency.

The light extraction structure 128 may have random surface roughness that is formed by wet etching, or be formed in a periodic pattern that is formed by a patterning process.

In this case, the light extraction structure 128 is formed to have an average period of about 200 nm to about 3000 nm. That is, when the light extraction structure 128 has surface roughness, the light extraction structure 128 may be formed such that an average distance between individual structures configuring the roughness is about 200 nm to about 3000 nm. Moreover, the light extraction structure 128 may be formed in a periodic pattern having a period of about 200 nm to about 3000 nm.

When the period of the light extraction structure 128 is less or greater than about 200 nm to about 3000 nm, the light extraction structure 128 may not efficiently extract visible series light and ultraviolet series light that are emitted from the light emitting structure 120.

Moreover, as described above, the period of the light emitting structure 128 is relevant to a reflectivity of the first layer 131 of the second electrode layer 130. That is, the period of the light extraction structure 128 may be selectively determined according to the material of the first layer 131.

The second electrode layer 130 may be formed as a single metal layer or a multi metal layer, and supply a power to the light emitting structure 120 together with the first electrode layer 110. The second electrode layer 130 may include the electrode pad 130a for wire bonding, and the branch 130b for current spreading.

The electrode pad 130a may be formed as one or in plurality. Therefore, wire bonding may be formed as one or in plurality.

The branch 130b branches from the electrode pad 130a and is formed at the top of the first conductive semiconductor layer 126, thereby preventing a current from being concentrated in the periphery of the electrode pad 130a.

The second electrode layer 130 may be formed to have a multi structure. For example, as illustrated in FIG. 3, the first layer being the lowermost layer may be formed of a metal having a high reflectivity, the third layer 133 being the uppermost layer is formed of a metal that has a high adhesive strength and thus is easily wire-bonded. The second layer 132 between the first layer 131 and the third layer 133 may be formed of a metal for preventing interlayer diffusion between the first and third layers 131 and 133.

The first layer 131, as described above, may be formed of a metal including Al when the light emitting structure 120 produces blue series light and the light extraction structure 128 is formed on the first conductive semiconductor layer 126. However, the first layer 131 is not limited thereto, and the first layer 131 may be formed to include at least one of Ag, Al, Pt, Pd, and Cu.

The second layer 132, for example, may be formed to include at least one of Ti, Ni, Cu, N, Zr, Cr, Ta, and Rh that are materials for preventing interlayer diffusion. The second layer 132 may have a multi-structure that is formed in a plurality of layers having different materials.

The third layer 133, for example, may be formed to include at least one of Ti, Au, Sn, Ni, Cr, Ga, In, Bi, Cu, and Ag that are materials having a high adhesive strength. The third layer 133 may have a multi-structure that is formed in a plurality of layers having different materials.

Hereinafter, a method of manufacturing a light emitting device according to a first embodiment will be described in detail. However, description that is repetitive of the above-described content will be omitted or schematically made.

FIGS. 5 to 9 are views illustrating a method of manufacturing the light emitting device 100, according to a first embodiment.

Figure 5:
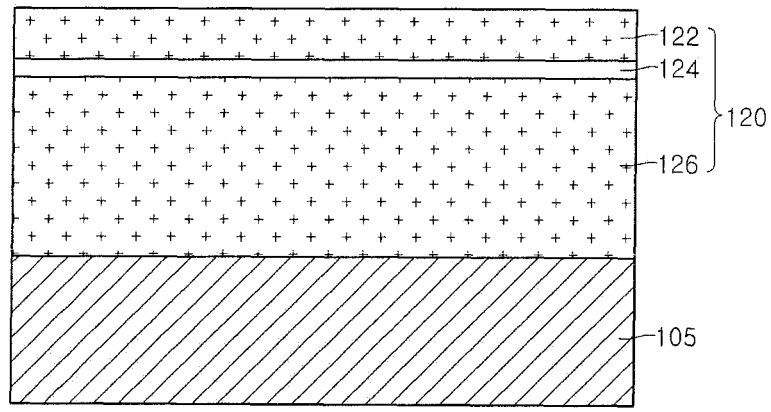
FIGS. 5 to 9 are views illustrating a method of manufacturing a light emitting device, according to a first embodiment.

Referring to FIG. 5, the light emitting structure 120 that includes the first conductive semiconductor layer 126, the active layer 124 and the second conductive semiconductor layer 122 may be formed on a growth substrate 105. An undoped semiconductor layer (not shown) or a buffer layer (not shown) may be further formed between the growth substrate 105 and the first conductive semiconductor layer 126.

The growth substrate 105 may be formed of at least one of a sapphire substrate ($Al_2O_3$) single crystal substrate, SiC, GaAs, GaN, ZnO, GaP, InP, Ge, and AlN, but it is not limited thereto.

By wet-cleaning the growth substrate 105, impurities of a surface can be removed. A top of the growth substrate 105 may be formed to be inclined for smoothly grow the light emitting structure 120 and enhancing light extraction efficiency of the light emitting device 100, or a plurality of convex patterns may be formed thereon. For example, the convex pattern may be formed in any one of a hemisphere shape, a polygon shape, a triangular pyramid shape, and a nano-pillar shape.

The light emitting structure 120, the undoped semiconductor layer (not shown) and the buffer layer (not shown) may be formed on the growth substrate 105 in at least one of Metal Organic Chemical Vapor Deposition (MOCVD), Chemical Vapor Deposition (CVD), Plasma-Enhanced Chemical Vapor Deposition (PECVD), Molecular Beam Epitaxy (MBE), and Hybride Vapor Phase Epitaxy (HVPE), but they are not limited thereto.

Figure 6:
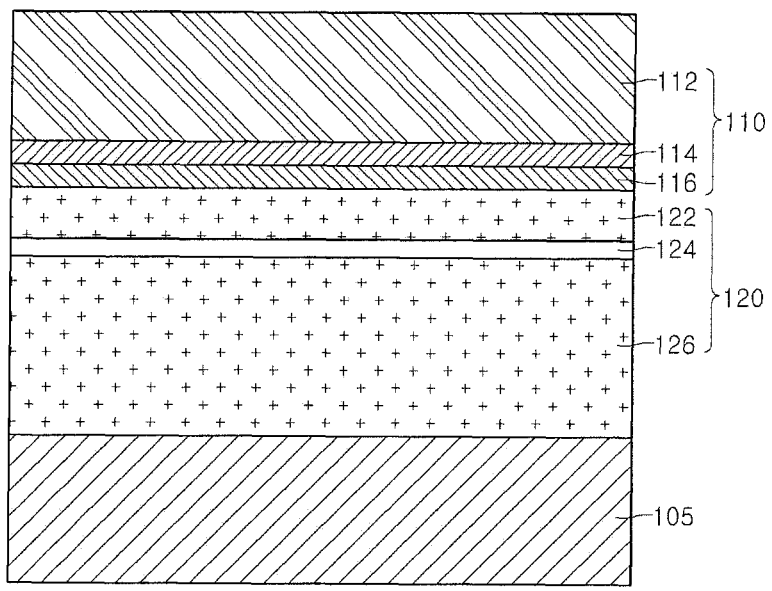

Referring to FIG. 6, the first electrode layer 110 may be formed on the light emitting structure 120.

The first electrode layer 110 may include a conductive support member 112, a reflection layer 114 on the conductive support member 112, and an ohmic layer 116 on the reflection layer 114.

The reflection layer 114 and the ohmic layer 116, for example, may be formed in any one of E-beam deposition, sputtering, and PECVD, but they are not limited thereto. The reflection layer 114 and the ohmic layer 16 may be only formed as one or may not be formed, but they are not limited thereto.

The conductive support member 112 may be formed in a deposition process or a plating process. Alternatively, the conductive support member 112 may be prepared as a separate sheet and formed in a bonding process. When the conductive support member 112 is formed in the bonding process, an adhesive layer (not shown) may be further formed between the conductive support member 112 and the reflection layer 114.

Figure 7:
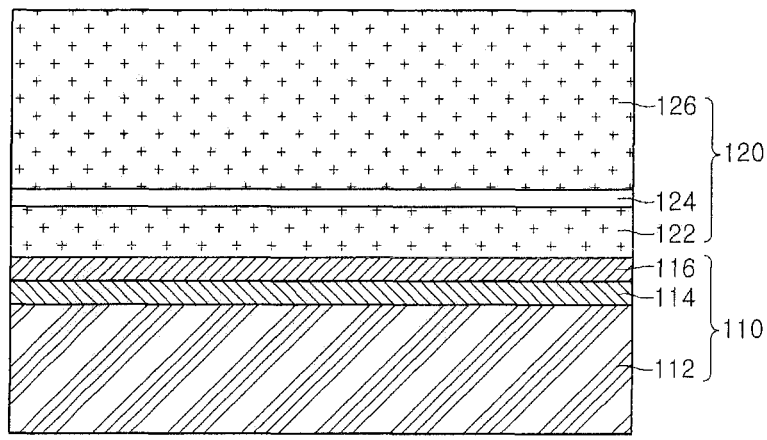

Referring to FIG. 7, the first conductive semiconductor layer 126 may be exposed by removing the growth substrate 105. In this case, the light emitting device of FIG. 6 may be reversed upward and downward for easily removing the growth substrate 105.

The growth substrate 105 may be removed in a Laser Lift Off (LLO) process using a high output laser or a Chemical Lift Off (CLO) process. Alternatively, by raking out the growth substrate 105, the growth substrate 105 may be removed.

Moreover, as the growth substrate 105 is removed, a surface defect layer may be formed in the exposed first conductive semiconductor layer 126. The surface defect layer may be removed in a wet etching process or a dry etching process.

Figure 8:
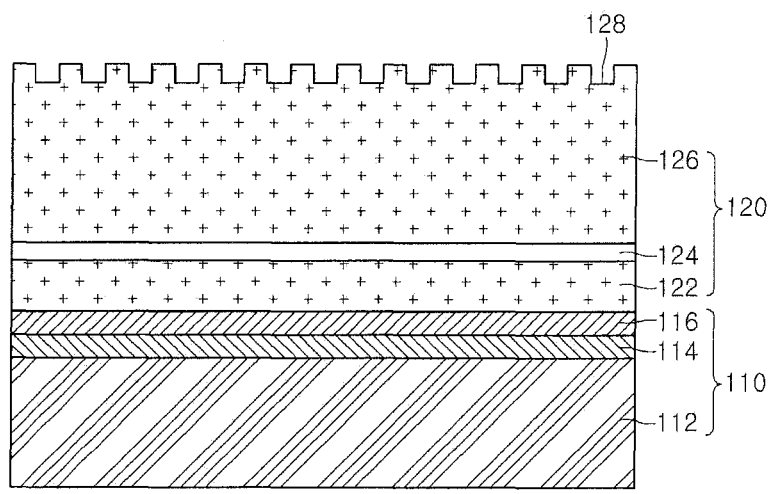

Referring to FIG. 8, the light extraction structure 128 is formed at the top of the first conductive semiconductor layer 126.

As described above, the light extraction structure 128 may be formed to have random surface roughness by a wet etching process, or formed to have a periodic pattern by a patterning process.

Figure 9:
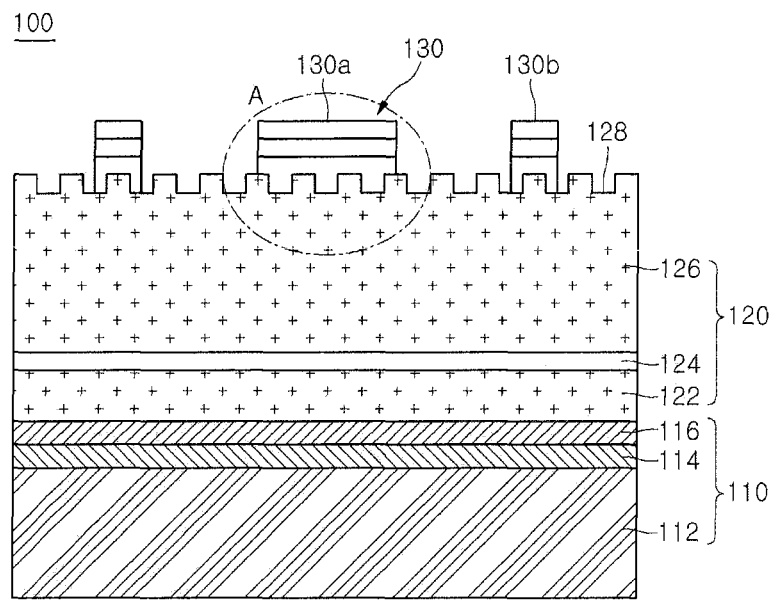

Referring to FIG. 9, the second electrode layer 130 may be formed on the first conductive semiconductor layer 126 of the light emitting structure 120, and thus the light emitting device 100 according to the first embodiment may be provided.

The second electrode layer 130 may include the electrode pad 130a, and the branch 130b that branches from the electrode pad 130a.

A mask pattern may be formed, and thereafter the second electrode layer 130 may be formed by performing a plating process or a deposition process along the mask pattern. However, the second electrode layer 130 is not limited thereto.

Moreover, a stack structure of the electrode pad 130a may be equal to or different from that of the branch 130b.

For example, in the electrode pad 130a, the third layer 133 having a high adhesive strength is required to be formed as the uppermost layer for wire bonding. However, the third layer 133 may not be formed in the branch 130b. Also, the branch 130b may be formed of a transparent electrode material.

Hereinafter, a light emitting device 100B according to a second embodiment will be described in detail. However, description that is repetitive of the first embodiment will be omitted or schematically made.

Figure 10:
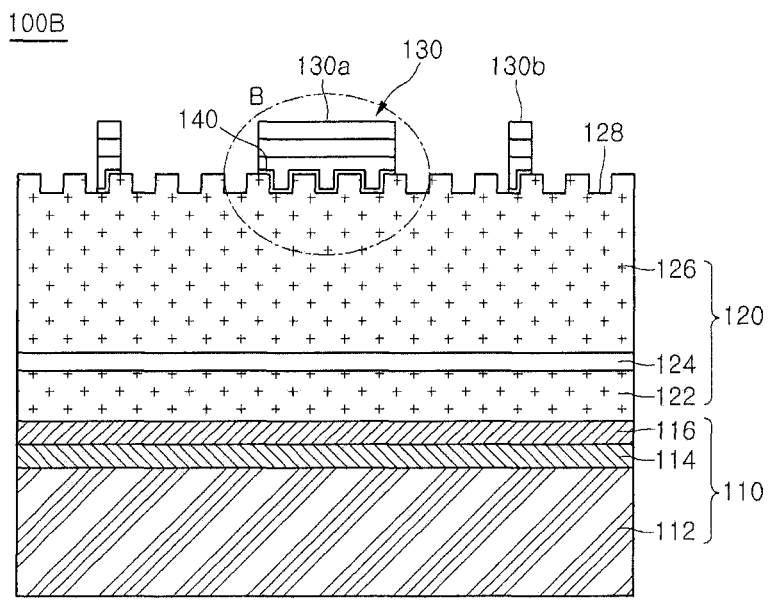
FIG. 10 is a side-sectional view of a light emitting device according to a second embodiment.
Figure 11:
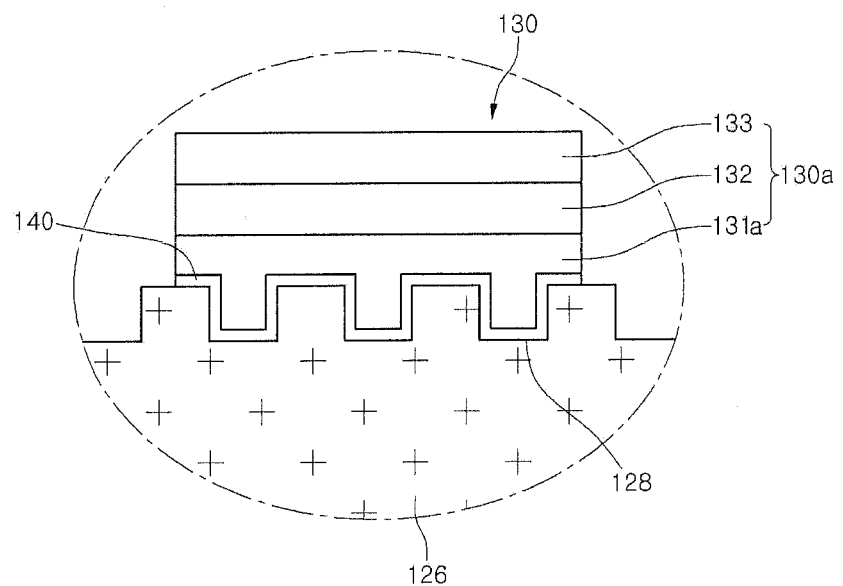
FIGS. 11 and 12 are enlarged views of a region B of FIG. 10.
Figure 12:
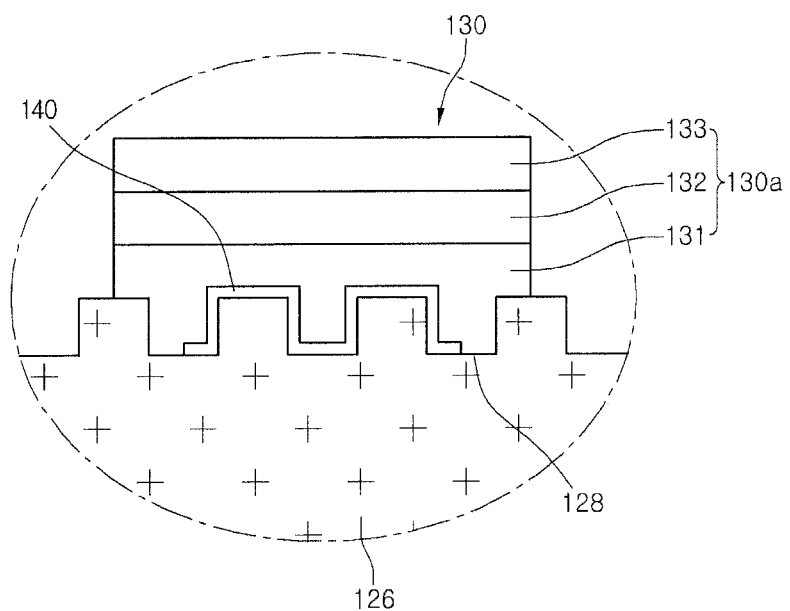

FIG. 10 is a side-sectional view of a light emitting device 100B according to a second embodiment. FIGS. 11 and 12 are enlarged views of a region B of FIG. 10.

Referring to FIGS. 1 to 12, the light emitting device 100B according to the second embodiment may include a first electrode layer 110, a light emitting structure 120 formed on the first electrode layer 110, a second electrode layer 130 formed at a partial region of a top of the light emitting structure 120, and a low refractive layer 140 which has a refractive index lower than that of the light emitting structure 120 and is formed between the light emitting structure 120 and the second electrode layer 130.

Moreover, a light extraction structure 128 may be formed at a top of the light emitting structure 120. The light extraction structure 128 extracts light, which is bound by total reflection internal to the light emitting structure 120, to the outside and thus enhances light extraction efficiency.

In the light emitting structure 100E according to the second embodiment, the low refractive layer 140 is formed unlike in the light emitting device 100 according to the first embodiment. Except for the low refractive layer 140, the light emitting structure 100B according to the second embodiment is the same as the light emitting device 100 according to the first embodiment.

The low refractive layer 140 may be formed of a material that has light transmission and a refractive index lower than that of the light emitting structure 120.

This is because by forming the low refractive layer 140, the amount of light that is totally reflected from an interface between the low refractive layer 140 and the first conductive semiconductor layer 126 increases, and thus the amount of light incident on a first layer 131a being the lowermost layer of the second electrode layer 130 decreases.

In other words, since the amount of light incident on the first layer 131a decreases, the amount of light that is changed to a surface Plasmon state and vanished as heat energy can be reduced by the degree where light is changed to heat energy. This leads to the increase in a reflectivity of the second electrode layer 130.

Moreover, the low refractive layer 140 changes an incident angle of light, and thus can allow light extraction efficiency to be enhanced due to refraction and diffusion.

The effect of the low refractive layer 140 can be seen even through an experiment result.

Figure 13:
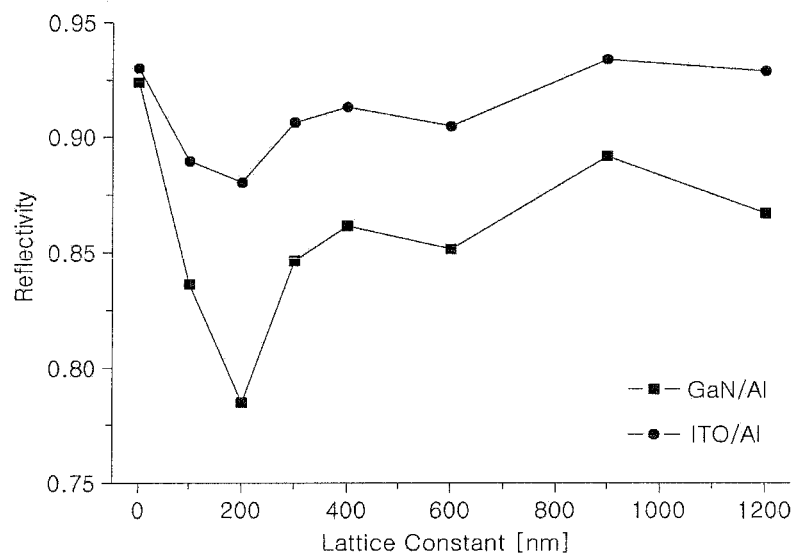
FIG. 13 is a graph showing an experiment result which is obtained by measuring a reflectivity of a second electrode layer of a light emitting device according to the first embodiment and a reflectivity of a second electrode layer of a light emitting device according to the second embodiment.

FIG. 13 is a graph showing an experiment result which is obtained by measuring a reflectivity of the second electrode layer 130 of the light emitting device 100 according to the first embodiment and a reflectivity of the second electrode layer 130 of the light emitting device 100B according to the second embodiment.

In FIG. 13, the X axis indicates a lattice constant of the light extraction structure 128, and the Y axis indicates a reflectivity of the second electrode layer 130.

The light emitting device 100 according to the first embodiment includes a structure where the first layer of the second electrode layer formed of Al directly contacts the light emitting structure formed of GaN. The light emitting device 100B according to the second embodiment includes a structure where the low refractive layer 140 is formed between the light emitting structure 120 formed of GaN and the first layer 131a of the second electrode layer 130 formed of Al.

Referring to FIG. 12, it is shown that a reflectivity of a case where the low refractive layer 140 is formed is higher than that of a case where the low refractive layer 140 is not formed.

The low refractive layer 140 may be selectively formed of one of a conductive material and an insulating material.

The low refractive layer 140 having a conductive material may be formed of conductive oxide, conductive nitride, or conductive fluoride, specifically, one of ITO, ZnO, IZO(In—ZnO), GZO(Ga—ZnO), AZO(Al—ZnO), AGZO(Al—Ga ZnO), IGZO(In—Ga ZnO), $IrO_x$, and $RuO_x$.

The low refractive layer 140 having an insulating material, for example, may be formed of at least one selected from the group consisting of $SiO_2$, $Si_xO_y$, $Si_3N_4$, $Si_xN_y$, $SiO_xN_y$, $Al_2O_3$, and $TiO_2$.

When the low refractive layer 140 is formed of an insulating material, as illustrated in FIG. 12, the area of the low refractive layer 140 may be less than that of the bottom of the second electrode 130 such that at least one portion of the second electrode layer 130 is electrically connected to the light emitting structure 120.

The low refractive layer 140 may be formed in E-beam deposition, sputtering, or PECVD, but it is not limited thereto.

As described above, the light emitting devices according to the embodiments enhance a reflectivity of the electrode formed on the semiconductor layer, thereby enhancing light emission efficiency.

Figure 14:
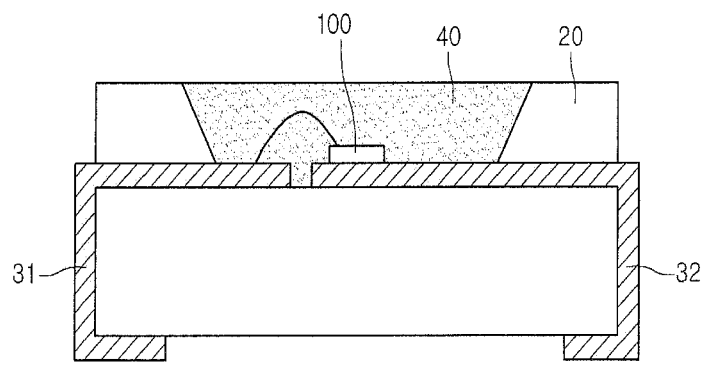
FIG. 14 is a sectional view of a light emitting device package including a light emitting device, according to an embodiment.

FIG. 14 is a sectional view of a light emitting device package including a light emitting device 100, according to an embodiment.

Referring to FIG. 14, the light emitting device package according to an embodiment includes a body 20, first and second conductive layers 31 and 32 disposed at the body 20, a light emitting device 100 that is disposed at the body 20 and is electrically connected to the first and second conductive layers 31 and 32, and a molding member 40 surrounding the light emitting device 100.

The body 20 may be formed to include a silicon material, a plastic material, or a metal material. An inclined plane may be formed around the light emitting device 100.

The first and second conductive layers 31 and 32 are electrically disconnected from each other, and supply a power to the light emitting device 100. Also, the first and second conductive layers 31 and 32 reflect light that is produced by the light emitting device 100, thereby increasing light efficiency. The first and second conductive layers 31 and 32 may emit heat produced by the light emitting device 100 to the outside.

The light emitting device 100 may be disposed on the body 20, the first conductive layer 31, or the second conductive layer 32.

A wire scheme is illustrated where the light emitting device 100 is electrically connected to the first and second conductive layers 31 and 32 through a wire, but it is not limited thereto. For example, the light emitting device 100 may be electrically connected to the first and second conductive layers 31 and 32 in a flip chip scheme or a die bonding scheme.

The molding member 40 may surround the light emitting device 100, thereby protecting the light emitting device 100. Also, a fluorescent material may be included in the molding member 40 and change a wavelength of light emitted from the light emitting device 100.

At least one lens may be formed on the molding member 40 or the body 20, and include a convex lens, a concave lens, or a lens having a concave-convex shape.

The light emitting device package according to an embodiment is arrayed in plurality, on a substrate. A light guide panel, a prism sheet, an diffusion sheet and a fluorescent sheet that are optical members may be disposed on a path of light emitted from the light emitting device package. The light emitting device package, the substrate, and the optical members may serve as a backlight unit or a lighting unit. For example, a lighting system may include a backlight unit, a lighting unit, a pointing device, a lamp, and a street lamp.

Figure 15:
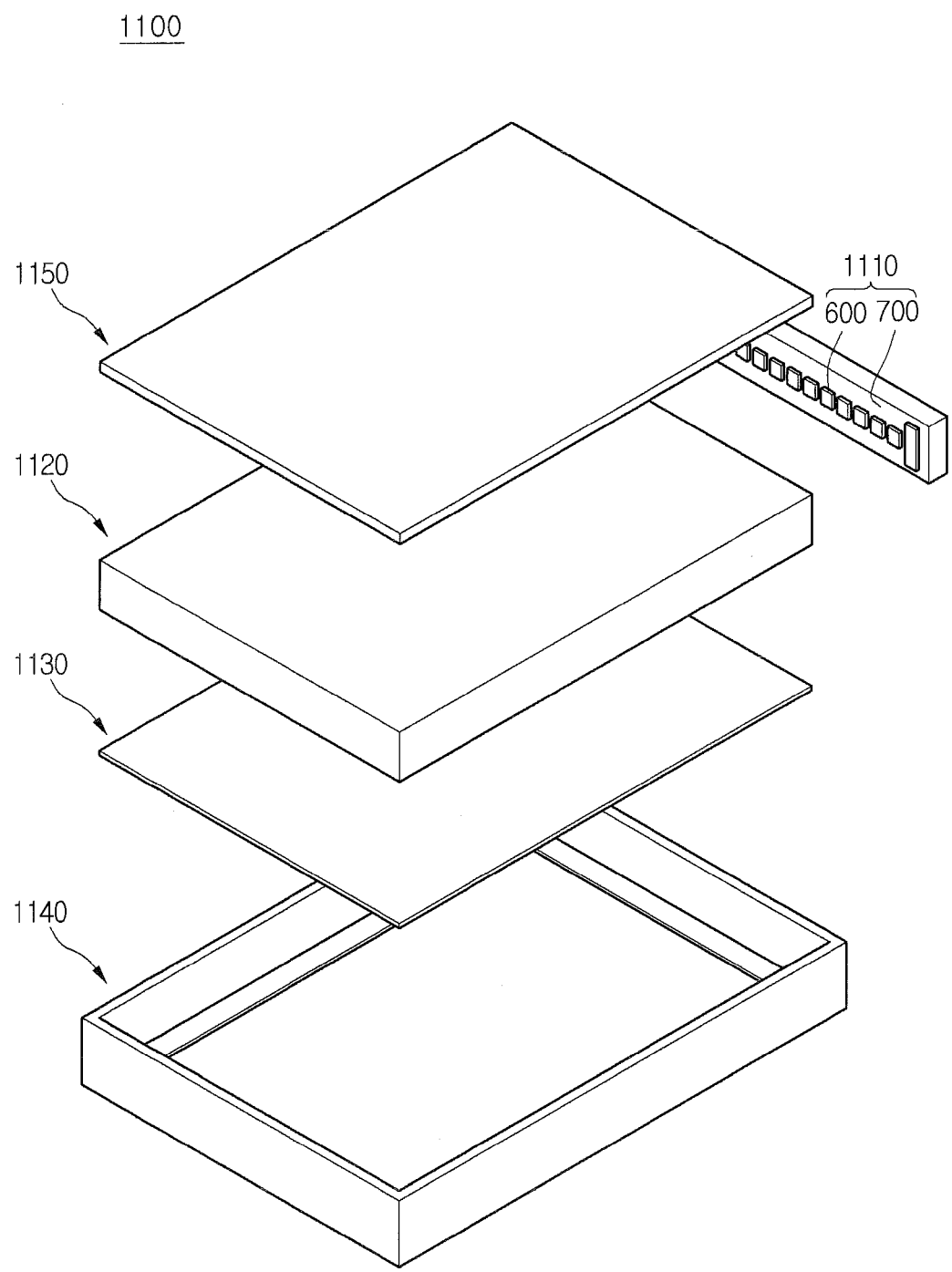
FIG. 15 is a view illustrating a backlight unit using a light emitting device or a light emitting device package, according to an embodiment.

FIG. 15 is a view illustrating a backlight unit using a light emitting device or a light emitting device package, according to an embodiment. A backlight unit 1100 of FIG. 15 is an example of a lighting system, but it is not limited thereto.

Referring to FIG. 15, the backlight unit 1100 includes a bottom frame 1140, a light guide member 1120 disposed in the bottom frame 1140, and a light emitting module 1110 that is disposed in at least one side or bottom of the light guide member 1120. Also, a reflection sheet 1130 may be disposed under the light guide member 1120.

A top of the bottom frame 1140 may be formed in an opened box shape such that the bottom frame 1140 accommodates the light guide member 1120, the light emitting module 1110 and the reflection sheet 1130, and the bottom frame 1140 may be formed of a metal material or a resin material. However, the bottom frame 1140 is not limited thereto.

The light emitting module 1110 may include a substrate 700, and a plurality of light emitting device packages 600 that are mounted on the substrate 700. The light emitting device packages 600 may provide light to the light guide member 1120. In the light emitting module 1110 according to an embodiment, the light emitting device packages 600 are disposed at the substrate 700, but the light emitting device 200 according to an embodiment may be directly disposed.

As illustrated in FIG. 15, the light emitting module 1110 may be disposed in at least one of inner sides of the bottom frame 1140, and therefore provide light to at least one side of the light guide member 1120.

The light emitting module 1110 may be disposed under the bottom frame 1140, and provide light to a bottom of the light guide member 1120. However, the light emitting module 1110 is not limited thereto, and may be variously modified according to a design of the backlight unit 1100.

The light guide member 1120 may be disposed inside the bottom frame 1140. The light guide member 1120 may convert light provided by the light emitting module 1110 into a flat light source, and guide the flat light source to a display panel (not shown).

The light guide member 1120, for example, may be a light guide panel. The light guide panel, for example, may be formed of one of acrylic resin-based resin such as polymethyl metaacrylate (PMMA), polyethylene terephthlate (PET) resin, poly carbonate (PC) resin, COC resin, polyethylene naphthalate (PEN) resin.

An optical sheet 1150 may be disposed on the light guide member 1120.

The optical sheet 1150, for example, may include a diffusion sheet, a light directing sheet, a brightness increasing sheet, and a fluorescent sheet. For example, the optical sheet 1150 may be formed by stacking the diffusion sheet, the light directing sheet, the brightness increasing sheet, and the fluorescent sheet. In this case, the optical sheet 1150 may conformally diffuse light emitted from the light emitting module 1110, and the diffused light may be directed to a display panel (not shown) by the light directing sheet. At this point, the light emitted from the light directing sheet is light that is polarized at random, and the brightness increasing sheet may increase the degree of polarization of the light emitted from the light directing sheet. The light directing sheet, for example, may be a horizontal or/and vertical prism sheet. The brightness increasing sheet, for example, may be a dual brightness enhancement film. Also, the fluorescent sheet may be a light-transmitting plate or film including a fluorescent material.

The reflection sheet 1130 may be disposed under the light guide member 1120. The reflection sheet 1130 may reflect light, which is emitted through a bottom of the light guide member 1120, to a light output surface of the light guide member 1120.

The reflection sheet 1130 may be formed of a resin material having a high reflectivity, for example, PET, PC, and PVC resins, but it is not limited thereto.

Figure 16:
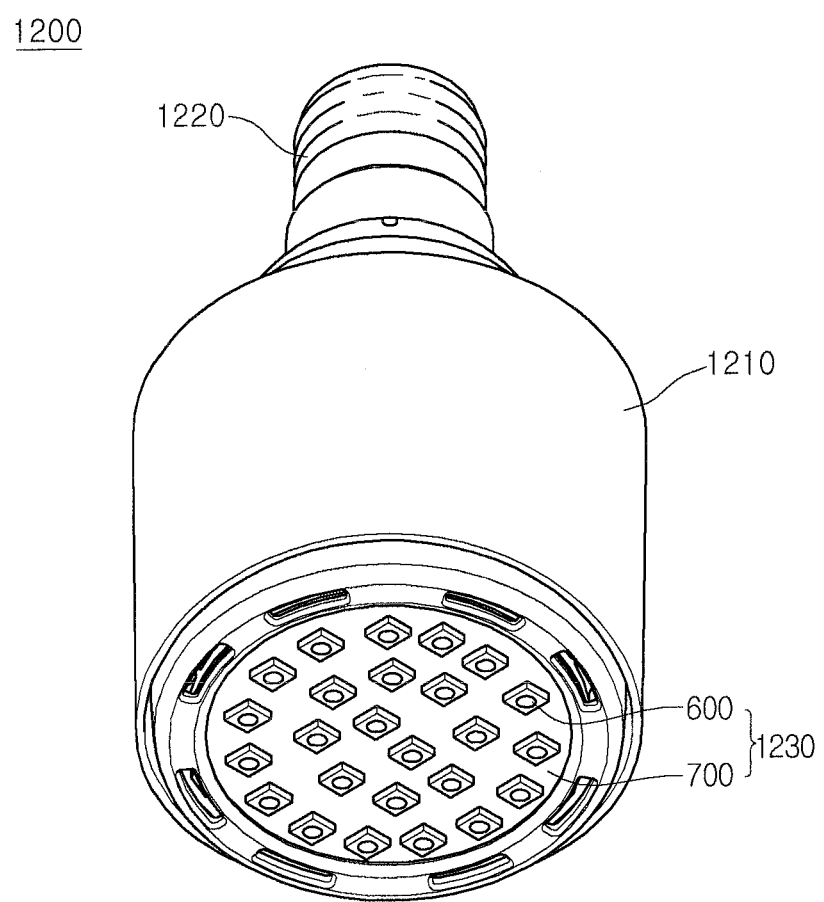
FIG. 16 is a perspective view of a lighting unit using a light emitting device or a light emitting device package, according to an embodiment.

FIG. 16 is a perspective view of a lighting unit using a light emitting device or a light emitting device package, according to an embodiment. A lighting unit 1200 of FIG. 16 is an example of a lighting system, but it is not limited thereto.

Referring to FIG. 16, the lighting unit 1200 may include a case body 1210, a light emitting module 1230 disposed at the case body 1210, and a connection terminal 1220 that is disposed at the case body 1210 and receives a power from an external power source.

The case body 1210 may be formed of a material having good heat radiation characteristic, for example, may be formed of a metal material or a resin material.

The light emitting module 1230 may include a substrate 700, and at least one light emitting device package 600 that is mounted on the substrate 700. In the light emitting module 1110 according to an embodiment, the at least one light emitting device package 600 is disposed at the substrate 700, but the light emitting device 200 according to an embodiment may be directly disposed.

The substrate 700 may be formed by printing a circuit pattern on an insulating material, for example, may include a Printed Circuit Board (PCB), a metal core PCB, a flexible PCB, and a ceramic PCB.

The substrate 700 may be formed of a material that efficiently reflects light, or formed of color that efficiently reflects light of a surface, for example, white color or silver color.

The at least one light emitting device package 600 may be mounted on the substrate 700. The at least one light emitting device package 600 may include at least one Light Emitting Diode (LED). The LED may include an ultraviolet (UV) LED emitting UV, and a colored LED that emits colored light such as red, green, blue, and white.

To obtain color sense and brightness, the light emitting module 1230 may be disposed to have the combination of various LEDs. To secure a high Color Rendering Index (CRI), for example, the light emitting module 1230 may be disposed by combining a white LED, a red LED, and a green LED. Also, a fluorescent sheet may be further disposed on a travel path of light emitted from the light emitting module 1230, and change the wavelength of light emitted from the light emitting module 1230. For example, when light emitted from the light emitting module 1230 has a blue wavelength band, the fluorescent sheet may include a yellow fluorescent material, and light emitted from the light emitting module 1230 passes through the fluorescent sheet to be finally seen as white light.

The connection terminal 1220 may be electrically connected to the light emitting module 1230 and supply a power. As illustrated in FIG. 16, the connection terminal 1220 is inserted through rotation and then coupled to an external power source in a socket scheme, but it is not limited thereto. For example, the connection terminal 1220 may be formed in a pin shape and inserted into the external power source, or connected to the external power source through wiring.

In the above-described lighting system, at least one of a light guide member, a diffusion sheet, a light directing sheet, a brightness increasing sheet and a fluorescent sheet may be disposed on a travel path of light emitted from the light emitting module, and a desired optical effect can be obtained.

As described above, the lighting system includes the light emitting device or the light emitting device package having excellent light emission efficiency according to an embodiment, thereby having excellent light emission efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first electrode layer;
a light emitting structure formed on the first electrode layer to emit blue series light having a main peak wavelength region of about 430 nm to about 470 nm, and comprising a light extraction structure; and
a second electrode layer comprising a first layer, which is formed of a metal material different from a wavelength of the blue series light in Plasmon frequencies, on the light extraction structure.

2. The light emitting device according to claim 1, wherein the light extraction structure is formed to have random surface roughness or a periodic pattern.

3. The light emitting device according to claim 1, wherein the light extraction structure has a period of about 200 nm to about 3000 nm.

4. The light emitting device according to claim 1, wherein the first layer is formed of Al.

5. The light emitting device according to claim 1, wherein the first electrode layer comprises:
a conductive support member;
a reflection layer on the conductive support member; and
an ohmic layer on the reflection layer.

6. The light emitting device according to claim 1, wherein the first layer is formed in correspondence with a shape of the light extraction structure.

7. A light emitting device comprising:
a first electrode layer;
a light emitting structure formed on the first electrode layer to emit blue series light having a main peak wavelength region of about 430 nm to about 470 nm, and comprising a light extraction structure;
a second electrode layer comprising a first layer, which is formed of a metal material different from a wavelength of the blue series light in Plasmon frequencies, at least a region of the light emitting structure; and
a low refractive layer between the light emitting structure and the second electrode layer, and having a refractive index lower than a refractive index of the light emitting structure.

8. The light emitting device according to claim 7, wherein the light extraction structure has a period of about 200 nm to about 3000 nm.

9. The light emitting device according to claim 7, wherein the low refractive layer is formed of a light-transmitting material.

10. The light emitting device according to claim 9, wherein the low refractive layer is formed of a conductive material.

11. The light emitting device according to claim 10, wherein the low refractive layer is formed of at least one selected from the group consisting of ITO, ZnO, IZO(In—ZnO), GZO(Ga—ZnO), AZO(Al—ZnO), AGZO(Al—Ga ZnO), IGZO(In—Ga ZnO), $IrO_x$, and $RuO_x$.

12. The light emitting device according to claim 9, wherein the low refractive layer is formed of an insulating material.

13. The light emitting device according to claim 12, wherein the low refractive layer is formed of at least one selected from the group consisting of $SiO_2$, $Si_xO_y$, $Si_3N_4$, $Si_xN_y$, $SiO_xN_y$, $Al_2O_3$, and $TiO_2$.

14. The light emitting device according to claim 12, wherein an area of the low refractive layer is less than an area of a bottom of the second electrode.

15. The light emitting device according to claim 7, wherein the first layer is formed of Al.

16. The light emitting device according to claim 7, wherein the second electrode layer comprises:
a third layer formed of a metal material having an adhesive property, on the first layer; and
a second layer formed of a metal material which prevents interlayer diffusion, between the first and third layers.

17. The light emitting device according to claim 7, wherein the first electrode layer comprises:
a conductive support member;
a reflection layer on the conductive support member; and
an ohmic layer on the reflection layer.

18. A light emitting device package comprising:
a body;
first and second conductive layers disposed at the body;
a light emitting device disposed at the body, and electrically connected to the first and second conductive layers; and
a molding member surrounding the light emitting device,
wherein the light emitting device comprises:
a first electrode layer;
a light emitting structure formed on the first electrode layer to emit blue series light having a main peak wavelength region of about 430 nm to about 470 nm, and comprising a light extraction structure; and
a second electrode layer comprising a first layer, which is formed of a metal material different from a wavelength of the blue series light in Plasmon frequencies, on the light extraction structure.

19. The light emitting device package according to claim 18, wherein the light emitting device further comprises a low refractive layer having a refractive index lower than a refractive index of the light emitting structure between the light emitting structure and the second electrode layer.

20. The light emitting device according to claim 19, wherein the low refractive layer is formed of a light-transmitting material.

* * * * *